United States Patent [19]

Aldag et al.

[11] Patent Number: 4,962,011

[45] Date of Patent: Oct. 9, 1990

[54] PHOTOPOLYMERIZABLE RECORDING MATERIALS CONTAINING A TRIAZOLE SENSITIZER AND PHOTORESIST LAYERS AND LITHOGRAPHIC PRINTING PLATES BASED THEREON

[75] Inventors: Reinhard Aldag, Ludwigshafen; Peter Neumann, Wiesloch; Andreas Boettcher, Leimen; Thomas Bluemel, Erpolzheim; Friedrich Seitz, Friedelsheim, all of Fed. Rep. of Germany

[73] Assignee: BASF Aktiengesellschaft, Ludwigshafen, Fed. Rep. of Germany

[21] Appl. No.: 194,954

[22] Filed: May 17, 1988

[30] Foreign Application Priority Data

May 21, 1987 [DE] Fed. Rep. of Germany ....... 3717038

[51] Int. Cl.$^5$ .................................. G03C 1/70
[52] U.S. Cl. .................................... 430/281; 430/292; 430/343; 522/14; 522/15; 522/16; 522/25; 522/26; 522/121
[58] Field of Search ............... 430/292, 343, 281; 522/14, 15, 16, 25, 26, 121

[56] References Cited

U.S. PATENT DOCUMENTS

| 3,284,205 | 11/1966 | Sprague et al. | 430/343 X |
|---|---|---|---|
| 3,427,161 | 2/1969 | Laridon et al. | 96/35.1 |
| 3,549,367 | 12/1970 | Teh-lin Chang | 430/281 |
| 3,552,973 | 1/1971 | Fishman | 96/90 |
| 3,615,568 | 10/1971 | Jenkins | 96/90 R |
| 3,880,659 | 4/1975 | Bailey et al. | 430/343 X |
| 3,883,351 | 5/1975 | Lewis | 96/35.1 |
| 3,899,338 | 5/1975 | Lewis | 96/115 P |
| 4,065,315 | 12/1977 | Yamazaki et al. | 96/48 QP |
| 4,162,274 | 7/1979 | Rosenkranz | 528/75 |
| 4,228,232 | 10/1980 | Rousseau | 430/271 |
| 4,268,610 | 5/1981 | Roos | 430/281 |
| 4,298,678 | 11/1981 | McKeever | 430/292 X |
| 4,304,923 | 12/1981 | Rousseau | 562/26 |
| 4,465,761 | 8/1984 | Takegawa et al. | 430/343 X |

FOREIGN PATENT DOCUMENTS

| 0005379 | 12/1981 | European Pat. Off. |
| 0019219 | 6/1983 | European Pat. Off. |
| 0138187 | 4/1985 | European Pat. Off. |
| 3400990 | 7/1985 | Fed. Rep. of Germany |
| 5582792 | 1/1982 | Japan |
| 80/01846 | 9/1980 | PCT Int'l Appl. |
| 1489425 | 10/1977 | United Kingdom |

OTHER PUBLICATIONS

Cescon et al., "Some Properties of Triarylimidazolyl Radicals and Their Dimers", J. Org. Chem., vol. 36, pp. 2262–2267, (1971).

R. A. Abramovitch, +E. M. Smith, "Pyridine and Its Derivatives", vol. 14, part 2, pp. 1–27.

Primary Examiner—Marion C. McCamish
Assistant Examiner—Cynthia Hamilton
Attorney, Agent, or Firm—Keil & Weinkauf

[57] ABSTRACT

Novel photopolymerizable recording materials suitable in particular for producing photoresist layers and lithographic printing plates are composed of one or more photopolymerizable, olefinically unsaturated organic compounds, optionally a polymeric binder, a photopolymerization initiator, a color-forming system composed of a color former and a photooxidant, a certain benzotriazole compound as a sensitizer and optionally further additive and/or auxiliary substances.

16 Claims, No Drawings

PHOTOPOLYMERIZABLE RECORDING MATERIALS CONTAINING A TRIAZOLE SENSITIZER AND PHOTORESIST LAYERS AND LITHOGRAPHIC PRINTING PLATES BASED THEREON

The present invention relates to photopolymerizable recording materials composed of one or more photopolymerizable, olefinically unsaturated organic compounds, optionally a polymeric binder, a photopolymerization initiator, a color-forming system, consisting of color former and photooxidant, and a sensitizer. They are suitable in particular for producing photoresist layers and lithographic printing plates.

Photopolymerizable recording materials for the purposes mentioned are known per se, They contain in general, besides a photopolymerizable, olefinically unsaturated organic compound, a polymeric binder and a photopolymerization initiator, a color-forming system which, on irradiation with actinic light, causes a color change in the irradiated areas. This color change is of great importance for the visual inspection and control of the recording materials following imagewise exposure. For instance, in the production of printed circuits or circuit boards by means of photoresist layers it is necessary to make sure after the imagewise exposure and before the removal of the unexposed areas from the photoresist layers that the negative was correctly emplaced. Furthermore, the color change makes it possible in the imagewise exposure of layers of photopolymerizable recording materials to check the image obtained following the development of the exposed layer and thereby make possible, for example, easy and reliable detection of any detachment of the image areas of the layer in the course of development. To permit effective visual inspection of these exposed layers, the colorforming system should on exposure bring about a very pronounced color contrast in the recording material, ide-. ally so that the color formation gives very dark images if viewed in yellow light. Moreover, the color-forming system must be stable to storage to avoid undesirable color deepening in the photopolymerizable recording material in the time between manufacture and use.

Color-forming systems consist in general of a colorless or slightly colored dye precursor (color former) and an activator which on irradiation with actinic light converts the dye precursor into the colored compound. Suitable color formers are in particular leuco dyes or the slightly colored free bases or lactone forms of dyes. The activators for the color formers are customarily photooxidants, in particular organic halogen compounds which split off halogen free-radicals on irradiation with actinic light. Reference is made in this context to for example DE-A-2,306,353, DE-A-2,718,200, EP-B-2,805, EP-B-5,379 and WO-A-80/01,846. It has also already been proposed to use hexaarylbisimidazoles as photooxidants (cf. DE-A-1,924,317 and EP-B-19,219). The existing photopolymerizable recording materials generally contain in addition a sensitizer to enhance the sensitivity and to improve the photoreaction, for example a tertiary amine of an aromatic carbonyl compound, for example Michler's ketone.

The color-forming systems used in the existing photopolymerizable recording materials frequently show on imagewise irradiation of these materials with actinic light only a weak color change and insufficient contrast between exposed and unexposed areas. Nor is the storage stability of the color-forming systems hitherto used for photopolymerizable recording materials satisfactory in many cases, a deepening in color being observable even on storage in the dark. Those color-forming systems which contain an organic halogen compound as activator for the color former furthermore adversely affect the processing properties of the photopolymerizable recording materials. For instance, photoresist layers produced from these recording materials are for example not completely removable from metallic substrates following imagewise exposure and development as is required for example in production of printed circuits or circuit boards, but leave behind on the substrate a more or less pronounced residual layer which interferes with the further processing of the products. Furthermore, the halogen content can lead to signs of corrosion on metallic substrates. There is therefore a need for further, improved colorforming systems for use in photopolymerizable recording materials of the type in question.

DE-A-2,046,018 describes photographic recording materials in which a color former system has been applied to a base material. These photographic, non-photopolymerizable recording materials serve to produce colored images. Their color former system consists of a colorless or virtually colorless color former which can be converted into the colored form by oxidation, and as the photooxidant a heterocyclic compound having an acyloxy- or alkoxy-substituted ring nitrogen atom. The color formers described are leuco dyes and derivatives thereof. The photooxidants mentioned are in particular specifically substituted N-alkoxy- and N-acyloxy-pyridinium salts. The photographic recording materials described in DE-A-2,046,018 give on exposure to actinic light only a relatively weak color change and/or require for a stronger contrast between exposed and unexposed areas significantly longer exposure times than are acceptable for photopolymerizable recording materials.

A further drawback of existing photopolymerizable recording materials where hexaarylbisimidazolyls are used as photoactive compounds can be seen in the strong fluorescence of the sensitizer additives described for example in EP-A-138,187. Photoresist layers produced from such recording materials show appreciably reduced resolution and consequently fine conducting path structures are no longer satisfactorily reproducible.

It is an object of the present invention to provide photopolymerizable recording materials which incorporate a good color former system and which overcome the disadvantages of prior art products, i.e. which are simple and easy to obtain, which in the relatively short expdsure times required for photopolymerizable recording materials show on exposure to actinic light a large color change to produce a crisp and marked contrast between exposed and unexposed areas, which are highly stable to storage and which do not leave a residual layer on metallic substrates.

Sensitizers for use in the color-forming system of a photopolymerizable recording material include in the wider sense compounds which on irradiation of the photopolymerizable recording material with actinic light are able to absorb the actinic light and to transfer the excitation energy or electrons to the photochemically active compounds, i.e. the photooxidant and the photopolymerization initiator, and thereby activate the photochemical reaction in the photopolymerizable recording material on irradiation thereof with actinic light.

We have found, surprisingly, that this object is achieved with photopolymerizable recording materials of the type described at the beginning when a substance acting as a photoinitiator and/or photooxidant is used as a sensitizer together with a certain triazole derivative.

The present invention accordingly provides a photopolymerizable recording material composed of one or more photopolymerizable olefinically unsaturated organic compounds, optionally a polymeric binder, one or more photopolymerization initiators, a color-forming system which on irradiation with actinic light causes an increase in the color intensity of the recording material, a sensitizer and optionally further additive and/or auxiliary substances, wherein the sensitizer comprises one or more compounds of the general formula (I)

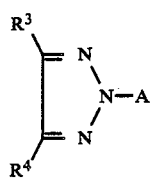

where
A is one of the radicals of the general formulae (II) to (IV)

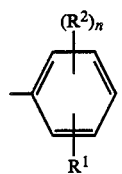

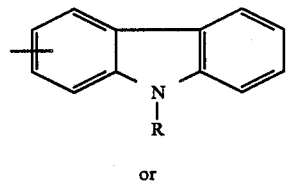

or

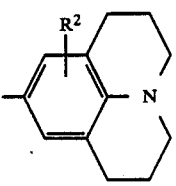

R is hydrogen or $C_1$- to $C_8$-alkyl,
$R^1$ is $C_1$- to $C_{12}$-alkyl, $C_1$- to $C_{12}$-alkoxy, phenyl or an $NR^5R^6$ group where $R^5$ and $R^6$ are identical to or different from each other and each is $C_1$- to $C_6$-alkyl, allyl, phen-$C_1$- to -$C_4$-alkyl, unsubstituted or $C_1$- to $C_4$-alkyl-, $C_1$- to $C_4$-alkoxy- and/or halogen-substituted phenyl, unsubstituted or OH—, halogen—, CN—, —O—CO—$C_1$- to —$C_6$-alkyl—or —CO—O—$C_1$- to -$C_6$-alkylsubstituted $C_1$- to $C_{12}$-alkyl or oxaalkyl of 3 to 12 carbon atoms and 1 to 5 oxygen atoms, or together form a heterocyclic, saturated or unsaturated ring system, $R^2$ is hydrogen, $C_1$- to $C_{12}$-alkyl, $C_1$- to $C_{12}$-alkoxy, halogen or trialkylsilyl,
n is 1 or 2,
$R^3$ and $R^4$ are identical to or different from each other and each is $C_1$- to $C_8$-alkyl, cycloalkyl, $CO_2R^7$ where $R^7$ is $C_1$- to $C_8$-alkyl or aryl, eg. phenyl or naphthyl, unsubstituted or halogen-, $C_1$- to $C_4$-alkyl- or $C_1$- to $C_4$-alkoxy-substituted phenyl or together form a carbocyclic or heterocyclic saturated or unsaturated fused ring system which is monosubstituted or polysubstituted by halogen, OH, CN, —O—CO—$C_1$- to -$C_6$alkyl, —CO—O—$C_1$- to -$C_8$-alkyl, trifluoromethyl, $C_3$- to $C_6$-cycloalkyl, $C_1$- to $C_8$-alkoxy, phen-$C_1$- to -$C_4$alkyl, unsubstituted or OH—, halogen-, CN—, —O—CO—$C_1$- to -$C_6$-alkyl- or —CO—O—$C_1$- to -$C_6$-alkyl-substituted $C_1$ to $C_{12}$-alkyl or oxaalkyl of 2 to 12 carbon atoms and 1 to 6 oxygen atoms, trialkylsilyl or where $R^8$ and $R^9$ are identical to or different from each other and each is $C_1$-$C_8$-alkyl, unsubstituted or OH-, halogen-, CN—, —O—CO—$C_1$- to -$C_6$-alkyl- or —CO—O—$C_1$- to -$C_6$-alkylsubstituted $C_1$- to $C_{12}$-alkyl or oxaalkyl of 3 to 12 carbon atoms and 1 to 5 oxygen atoms, phen-$C_1$- to -$C_4$alkyl or unsubstituted or $C_1$- to $C_4$-alkyl-, $C_1$- to $C_4$- alkoxy- and/or halogen-substituted phenyl, with the proviso that the maximum of the long-wave absorption band of these compounds is below 420 nm, preferably below 400 nm.

Preferred sensitizers are those compounds of the formula I where A is the radical of the general formula (II) and $R^1$ is in the para-position relative to the linking site with triazole ring, n is 1 and $R^1$ is preferably -$NR^5R^6$ where $R^5$ and $R^6$ have the abovementioned meanings and $R^3$ and $R^4$ together form a substituted or unsubstituted aromatic ring system, in particular compounds of the general formula (V)

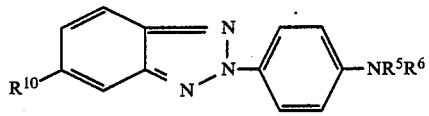

where $R^5$ and $R^6$ have the abovementioned meanings and $R^{10}$ is halogen.

The color-forming system present so as to cause an increase in the color intensity of the recording material according to the invention on irradiation with actinic light comprises in general (a) one or more colorless or virtually colorless organic compounds which are oxidizable to a colored compound, preferably leuco dyes and, in particular triarylmethane dyes in the leuco form, and (b) a photooxidant for the colorless or virtually colorless organic compound (a).

Preference is given to those photopolymerizable recording materials which contain one or more hexaarylbisimidazolyls or an N-alkoxypyridinium salt as photopolymerization initiator and/or photooxidant.

The present invention also provides photoresist layers and lithographic printing plates based on the photopolymerizable recording materials according to the invention.

The individual components of the photopolymerizable recording materials according to the invention will now be discussed in detail.

According to the invention, suitable sensitizers are compounds of the general formula (I)

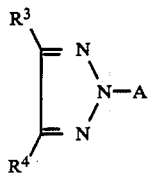 (I)

where
A is one of the abovementioned radicals of the general formulae (II) to (IV),
R is hydrogen or $C_1$- to $C_8$-alkyl, eg. methyl or ethyl,
$R^1$ is $C_1$- to $C_{12}$-alkyl, eg. methyl, ethyl, n-propyl, isopropyl, n-butyl, isobutyl, tert-butyl, tert-amyl, hexyl, octyl or dodecyl, $C_1$- to $C_{12}$-alkoxy, eg. methoxy, ethoxy, propoxy, butoxy or hexyloxy, phenyl or $NR^5R^6$ where $R^5$ and $R^6$ are identical to or different from each other and each is $C_1$- to $C_6$-alkyl, eg. methyl, ethyl, propyl or butyl, allyl, phen-$C_1$- to -$C_4$-alkyl, eg. benzyl or phenylethyl, or unsubstituted or $C_1$- to $C_4$-alkyl-, eg. methyl-, ethyl-, propyl- or butyl-, $C_1$- to $C_4$-alkoxy-, eg. methoxy-, ethoxy-, propoxy- or butoxy-, and/or halogen-, eg. fluorine-, chlorine- or bromine-substituted phenyl, unsubstituted or OH—, halo-gen-, CN—, —O—CO—$C_1$- to -$C_6$-alkyl- or —CO—O-$C_1$- to -$C_6$-alkyl-substituted $C_1$- to $C_{12}$-alkyl or oxaalkyl of 2 to 12 carbon atoms and 1 to 5 oxygen atoms, eg. methoxyethyl, ethoxyethyl, $CH_3$-O-$(CH_2$-$CH_2$-O$)_x CH_2$-$CH_2$ or $C_2H_5$-O-$(CH_2$-$CH_2$-O$)_x CH_2$-$CH_2$-, where X is an integer from 1 to 4, or together form a heterocyclic, saturated or unsaturated ring system, in which case for example $R^5$ and $R^6$ are bonded together to form a 5- or 6-membered heterocyclic saturated or unsaturated N-containing ring system, eg. a julolidine, carbazole, morpholine, piperidine or N-alkylpiperazine radical,
$R^2$ is hydrogen, $C_1$- to $C_{12}$-alkyl, eg. methyl, ethyl, propyl, n-butyl, isobutyl, tert-butyl, tert-amyl, hexyl, octyl or dodecyl, $C_1$- to $C_6$-alkoxy, eg. methoxy, ethoxy, propoxy, butoxy or hexyloxy, halogen, eg. fluorine, chlorine or bromine, or trialkylsilyl of 1 to 4 carbon atoms in the alkyl group, eg. trimethylsilyl or tert-butyldimethylsilyl,
$R^3$ and $R^4$ are identical to or different from each other and each is $C_1$- to $C_8$-alkyl, eg. methyl, ethyl, propyl, hexyl or octyl, cycloalkyl, eg. cyclopentyl or cyclohexyl, $CO_2R^7$ where $R^7$ is $C_1$- to $C_8$-alkyl, eg. methyl ethyl, propyl or butyl, or aryl, eg. phenyl or naphthyl, unsubstituted or halogen-, eg. fluorine-, chlorine- or bromine-, $C_1$- to $C_4$-alkyl-, eg. methyl-, ethyl-, propyl- or butyl-, or $C_1$- to $C_4$-alkoxy-, eg. methoxy-, ethoxy-, propoxy- or butoxy-substituted phenyl, or together form a carbocyclic or heterocyclic saturated or unsaturated fused ring system, eg. a cyclopentane, cyclohexane, benzene, pyridine or pyrimidine ring which is monosubstituted or polysubstituted by halogen, eg. fluorine, chlorine, bromine or iodine, OH, CN, —O—CO—$C_1$- to -$C_6$-alkyl, eg. acetoxy or propionoxy, —CO—O—$C_1$- to -$C_8$-alkyl, eg. ethoxycarbonyl or pentoxycarbonyl, trifluoromethyl, $C_3$- to $C_6$-cycloalkyl, eg. cyclopentyl or cyclohexyl, $C_1$- to $C_8$-alkoxy, eg. methoxy, ethoxy, propoxy or hexoxy, unsubstituted or OH-, halogen-, CN—, —O—CO—$C_1$- to -$C_6$-alkyl- or —CO—O—$C_1$-to $C_6$-alkyl- substituted $C_1$- to $C_{12}$-alkyl, eg. cyanoethyl, cyanopropyl, cyanooctyl, hydroxyethyl, hydroxy propyl, hydroxyhexyl, chloroethyl, bromoethyl, methoxymethyl, ethoxymethyl, acetoxymethyl, acetoxyethyl or oxaalkyl of 2 to 12 carbon atoms and 1 to 6 oxygen atoms, phen-$C_1$- to $C_4$-alkyl, eg. benzyl, trialkylsilyl of 1 to 4 carbon atoms in the alkyl group, groups of the formulae

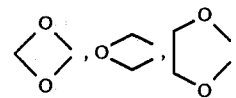

and/or $NR^8R^9$ where $R^8$ and $R^9$ are identical to or different from each other and each is alkyl of 1 to 8 carbon atoms, eg. methyl, ethyl, propyl, butyl, tertamyl, hexyl or octyl, unsubstituted or OH-, halogen-, eg. fluorine-, chlorine- or bromine-, CN—, —O—CO—$C_1$to -$C_6$- alkyl- or CO—O—$C_1$- to -$C_6$-alkyl-substituted alkyl or oxaalkyl of 3 to 12 carbon atoms and 1 to 5 oxygen atoms, eg. methoxyethyl, ethoxyethyl, $CH_3$—O—$(CH_2$-$CH_2$—O$)_n$-$CH_2$-$CH_2$- or $C_2H^5$—O—$(CH_2$-$CH_2$—O$)_n$—$CH_2CH_2$-, where n is an integer from 1 to 4, phen-$C_1$- to -$C_4$-alkyl, eg. benzyl or unsubstituted or $C_1$- to $C_4$-alkyl-, $C_1$- to $C_4$-alkoxy- or halogensubstituted phenyl, with the proviso that the maximum of the long-wave absorption band of these compounds is below 420 nm, preferably below 400 nm.

Preferred sensitizers for the photopolymerizable recording materials according to the invention are those of the general formula (I) where A is the radical of the general formula (II), in particular the radical

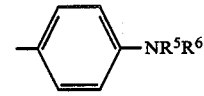

where $R^5$ and $R^6$ each have the abovementioned meanings and $R^3$ and $R^4$ together form an unsubstituted or substituted aromatic ring system, i.e. compounds of the general formula (V)

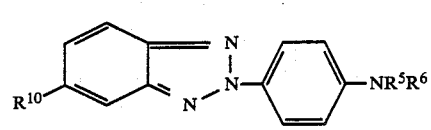 (V)

where $R^5$ and $R^6$ each have the abovementioned meansings and $R^{10}$ is chlorine, bromine or iodine.

Examples of suitable and very particularly preferred sensitizers are:

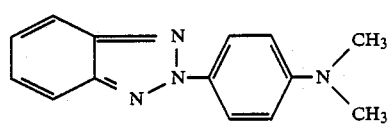 (VI)

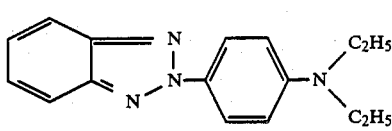 (VII)

-continued

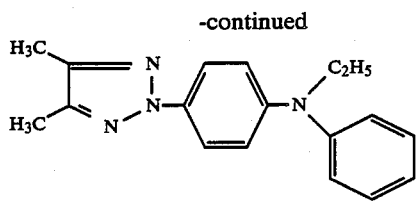
(VIII)

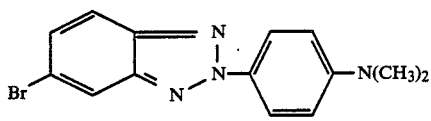
(IX)

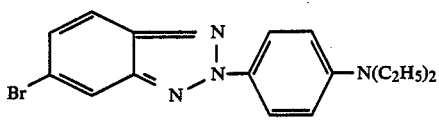
(X)

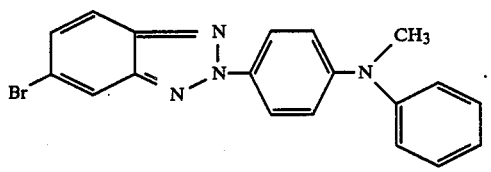
(XI)

The use according to the invention of sensitizers of the type described above in the color-forming system together with photooxidants b) surprisingly brings about in the photopolymerizable recording materials according to the invention a very substantial deepening in color intensity and contrast formation even in the relatively short exposure times to actinic light required for photopolymerizable recording materials.

The compounds which according to the invention act as sensitizers are known from DE-A-3,324,641, DE-A3,410,700 and DE-A-3,400,990 or can be prepared by known methods of organic chemistry, as described for example in Houben-Weyl, Methoden der organischen Chemie, 4th edition, volume X/3, pages 425 ff, for example from orthoaminoazo compounds of the formula (XII)

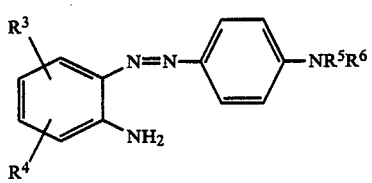
(XII)

or ortho-nitro compounds of the formula (XIII)

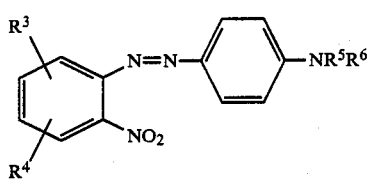
(XIII)

where $R^3$, $R^4$, $R^5$ and $R^6$ have the abovementioned meanings.

The sensitizers are generally used in amounts of from 0.01 to 10, preferably of from 0.1 to 1, % by weight, based on the photopolymerizable composition.

Suitable photooxidants (b) for use in the colorforming system of the photopolymerizable recording materials according to the invention comprise in particular b1) hexarylbisimidazolyls of the formula (XIV) or a structurally isomeric form

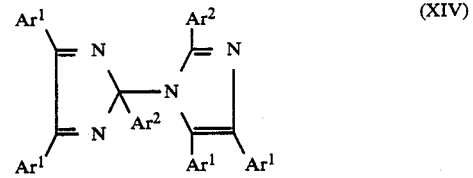
(XIV)

where $Ar^1$ and $Ar^2$ are as defined below, or b2) hetaromatic saltlike systems containing one or more groups of the formula (XV)

(XV)

The term saltlike systems as used herein also includes inner salts, i.e. ionic compounds where the cationic and anionic groups are linked to each other by covalent bonds. A suitable hetaromatic system in these salts which contains one or more groups of the abovementioned general formula (XV) comprises in particular six-membered hetaromatic rings containing one, two or even three ring nitrogen atoms and ring-substituted derivatives thereof, including the benzofused and hetarylfused representatives.

By proper selection of the ring substitution in the radicals Ar of the formula (XIV), or in the hetaromatic system, and the radical $R^{11}$ in the group of the general formula (XV) it is possible to affect and vary the activity on irradiation with actinic light and the stability of photooxidants (b). In addition, the anions in photooxidants (b2) also have an effect on the properties of the photopolymerizable recording materials. Customarily and advantageously, the photoxidant (b) is chosen in such a way that its molar extinction coefficient $\epsilon$ in the wavelength range from 300 to 420 nm, in particular in the range from 320 to 400 nm, is smaller than that of the sensitizer also present in the photopolymerizable recording materials according to the invention for photooxidant (b) and, if present, of the sensitizer for the photopolymerization initiator.

Photooxidants (b1) are according to the formula (XIV) 2,4,5-triarylimidazole dimers where two imidazole radicals are linked by a covalent bond and $Ar^1$ is substituted or unsubstituted phenyl, preferably phenyl substituted in the 4-position by $C_1$-$C_6$-alkyl or $C_1$-$C_6$-alkoxy, and $Ar^2$ is phenyl or preferably phenyl substituted in the 2- or 2'-position by halogen, such as F, Cl or Br, or by alkyl. The 2,4,5-triarylimidazole dimers convert under the influence of light and/or heat into the true photooxidants, namely triarylimidazolyl radicals.

· Particular preference is given to 2,2'-bis(o-chlorophenyl)-4,4',5,5'-tetraphenylbisimidazole and 2,2'-bis(o-chlorophenyl)-4,4',5,5'-tetra(p-methoxyphenyl)-bisimidazole.

These hexaarylbisimidazoles are known per se or are easily preparable by methods as described for example in J. Org. Chem. 36 (1971), 2262.

Photooxidants (b2) include in particular those pyridinium, pyrazinium and pyrimidinium salts which contain a group of the abovementioned general formula (XV) built in the hetaromatic ring, and also the ring-substituted derivatives thereof which contain one or more ring substituents of the abovementioned kind in the hetaromatic ring, and also fused derivatives thereof, for example benzofused pyridinium salts of the type in question, such as for example the corresponding unsubstituted or ring-substituted quinolinium, isoquinolinium or phenanthridinium salts. In the general formula (XV) for photooxidants (b2), R″ can be substituted or unsubstituted alkyl or aryl, or cycloalkyl. Further photooxidants are recited in detail in German Patent Application P O.Z. 0050/39193. The radical R″ in the group of the general formula (XV) is preferably alkyl or aryl, in particular alkyl of 1 to 6 carbon atoms. Preferred ring substituents for these salts include in particular substituted or unsubstituted alkyl. Preferred anions for these salts are inter alia benzenesulfonate, tosylate, alkylsulfonate, trifluoromethanesulfonate or tetrafluoroborate anions. The N-alkoxy- and N-aryloxypyridinium salts, the N-alkoxy- and N-aryloxypicolinium salts and also the N-alkoxy- and N-aryloxylutidinium salts have proved to be particularly advantageous for use according to the invention.

Photooxidants (b2) include for example compounds of the following general formulae (XVI) to (XXIV):

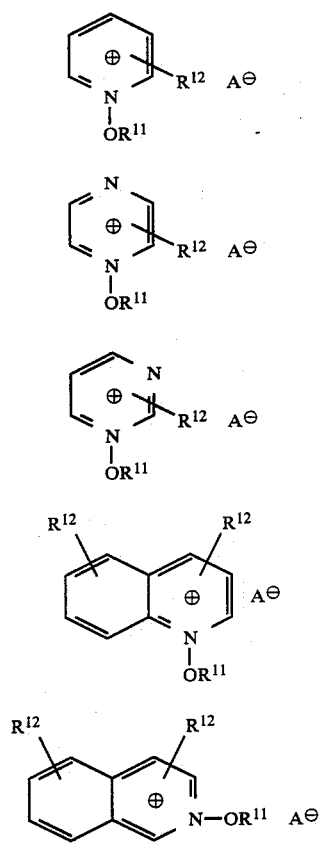

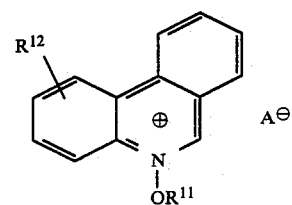

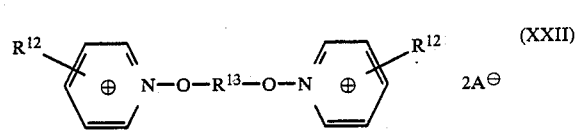

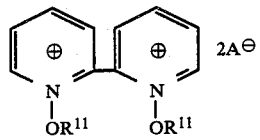

In these formulae (XVI) to (XXIV) $R^{11}$ is preferably alkyl or aryl, in particular alkyl of 1 to 6 carbon atoms, eg. methyl, ethyl or i-propyl. In these formulae $R^{12}$ is hydrogen (corresponding to an unsubstituted hetaromatic ring) or one or more ring substituents of the abovementioned type. Preferably the $R^{12}$s are hydrogen or one or more, substituted or unsubstituted, alkyl, aryl, alkoxy or chlorine. In particular, $R^{12}$ is hydrogen or one or more methyl, preferably 2methyl, 2,6-dimethyl, or in the general formulae (XVI), (XVII) and (XXII), even 3,5-dimethyl. In the formula (XXII), is alkylidene, in particular of 2 to 6 carbon atoms or xylidene, eg. p-xylidene. Furthermore, in the formulae (XVI) to (XXIV), even 3,5-dimethyl. In the formula (XXII), $R^{13}$ is alkylidene, in particular of 2 to 6 carbon atoms or xylidene, eg. p-xylidene. Furthermore, in the formulae (XVI) to (XXIV) $A^\ominus$ is an acid anion, in particular of the type mentioned above. Preferred acid anions for the compounds of the general formulae (XVI) to (XXIV) are the benzenesulfonate, toluenesulfonate, methylsulfonate, n-octylsulfonate, tetrafluoroborate and trifluoromethanesulfonate anion. Where one of the radicals $R^{11}$ or $R^{12}$ contains an anion group, for example a sulfonate group, it is of course the case that the anion disappears in the general formulae (XVI) to (XXIV).

Of the salts to be used as photooxidants (b), compounds of the general formula (XVI) are of particular importance, particularly good utility being possessed specifically by those compounds where $R^{12}$ is hydrogen or one or two methyls and $R^{11}$ is alkyl of 1 to 3 carbon atoms, such as methyl, ethyl or i-propyl.

Examples of compounds which according to the invention are usable as photooxidants (b2) in the photopolymerizable recording materials are: N-methoxy-2-picolinium bromide, N-methoxy-2-picolinium methylsulfate, N-methoxy-2-picolinium methanesulfonate, N-methoxy-2-picolinium trifluoromethanesulfonate, N-methoxy-2-picolinium n-octylsulfonate, N-methoxy-2-picolinium o/p-dodecylbenzenesulfonate, N-methoxy-2-picolinium hexachloroantimonate, N-methoxy-2-picolinium n-pentylsulfonate, N-ethoxy-2-picolinium bromide, N-ethoxy-2-picolinium n-pentylsulfonate, N-ethoxy-2-picolinium n-octylsulfonate, N-ethoxy-2-picolinium p-toluenesulfonate, N-ethoxy-2-picolinium tetrafluoroborate, N-ethoxy-2-picolinium hexafluorophosphate, N-ethoxy-2-picolinium hexachloroantimonate, N-isopropoxy2-picolinium p-toluenesulfonate, O-(2'-picolinium-1'-yl)3-hydroxypropanesulfonate, N-ethoxy-3-picolinium n-pentylsulfonate, N-ethoxy-3-picolinium n-octylsulfonate, N-methoxy-4-picolinium methanesulfonate, N-methoxy-4-picolinium n-octylsulfonate, N-methoxy-4-picolinium p-toluenesulfonate, N-ethoxy-4-picolinium n-pentylsulfonate, N-ethoxy-4-picolinium n-octylsulfonate, N-ethoxy-4-methoxypyridinium tetrafluoroborate, 1,4-dimethoxypyridinium tetrafluoroborate, N-tert-butoxypyridinium perchlorate, N-methoxy-3,5-lutidinium p-toluenesulfonate, N-methoxy2,6-lutidinium bromide, N-methoxy-2,6-lutidinium trifluoromethanesulfonate, N-methoxy-2,6-lutidinium p-toluenesulfonate, N-methoxy-2,6-lutidinium hexachloroantimonate, N-ethoxy-2,5-lutidinium tetrafluoroborate, N-ethoxy-2,6-lutidinium hexachloroantimonate, N-ethoxy-2,6-lutidinium hexafluorophosphate, O -(2',6'-lutidinium-1'-yl)-3-hydroxypropanesulfonate, N-methoxy-2-styrylpyridinium p-toluenesulfonate and N,N'-p-xylyleneoxybis(2-methylpyridinium) dibromide.

The salts of the abovementioned kind to be used as photooxidants (b2) can be prepared in a conventional manner. Reference may be made in this context for example to R.A. Abramovitch and E.M. Smith in Pyridine and its Derivatives, volume 14 supplement, part 2, page 1 ff, J. Wiley, New York (1974).

The color-forming system present in the photopolymerizable recording materials according to the invention, which on irradiation of the recording materials with actinic light causes an increase in the color intensity in these materials, contains besides photooxidants (b) of the aforementioned type one or more colorless or virtually colorless organic cDmpounds (a) which are oxidizable to colored compounds. These color-forming, initially colorless or virtually colorless organic compounds (a) will hereinafter also be referred to as color formers. Suitable color formers (a) are in particular leuco dyes, a leuco dye being the reduced form of a dye and having in general 1 or 2 hydrogen atoms whose removal, together with one or two electrons leads to generation of the dye. These leuco dyes are essentially colorless or are at most slightly colored in a low-intensity color which is appreciably different from the color of the actual dye (oxidized form). Suitable leuco dyes are in particular the diarylmethane and triarylmethane dyes in their leuco form and the leuco forms of dyes having a triarylmethane structure where two of the aryl radicals are linked with each other by an N, S or 0 atom. This includes inter alia the leuco form of aminoacridine dyes, of aminoxanthene dyes and of aminothioxanthene dyes. Also suitable are leuco dyes of the triarylmethane type where one dialkyl- or alkylaryl-aminophenyl radical has been replaced by an N-alkyl-substituted carbazolyl group. Color formers (a) can also be for example leucomethines. Leuco dyes which are suitable for use as color formers (a) for the photopolymerizable recording materials according to the invention are described for example in US-A-3,552,973. Of particular interest here are leucotriarylmethane dyes, eg. leuco crystal violet, leuco malachite green, leuco basic blue, leuco pararosaniline and leuco patent blue A or V.

The ratio of color former (a) and photooxidant (b) in the photopolymerizable recording materials has to be chosen in such a way as to ensure in all cases a sufficient color change on irradiation with actinic light. It is usually found to be sensible to use the photopolymerizable photooxidant (b) in a small excess (by weight) compared with color former (a). As for the rest, quantities and mixing ratios of color former (a) and photooxidant (b) are selected in such a way in a conventional manner that the photopolymerizable recording materials meet the stated requirements in respect of exposure time, color contrast etc.

Besides sensitizer and a color-forming system of the type described above, the photopolymerizable recording materials according to the invention contain one or more photopolymerizable, olefinically unsaturated organic compounds, optionally a polymeric binder, one or more photopolymerization initiators and optionally further additive and/or auxiliary substances. These further constituents of the photopolymerizable recording materials according to the invention can be the compounds used in conventional photopolymerizable compositions as used for producing overcoats, printing plates, photoresist materials and the like and described for example in the references cited at the beginning.

The photopolymerizable, olefinically unsaturated organic compounds can be olefinically unsaturated monomers, olefinically unsaturated oligomers and/or polymers containing photopolymerizable, olefinic double bonds. The photopolymerizable, olefinically unsaturated organic compounds contain preferably vinylic double bonds, in particular vinyl groups activated by conjugation and/or adjacency to 0 or N atoms. This includes in particular those vinyl groups adjacent to ester or amide groups, eg. acryloyl and methacryloyl groups. The photopolymerizable, olefinically unsaturated organic compounds can be not only monofunctional but also polyfunctional, i.e. they can possess one or indeed more than one photopolymerizable olefinic double bond. Customarily, the photopolymerizable recording materials contain bifunctional or polyfunctional olefinically unsaturated, photopolymerizable compounds alone or mixtures thereof with monofunctional olefinically unsaturated photopolymerizable compounds. The photopolymerizable olefinically unsaturated monomers have in general a molecular weight of up to about 1,000. The number average molecular weight of the photopolymerizable olefinically unsaturated oligomers is preferably within the range from 1,000 to 10,000, in particular from about 1,500 to 6,000. The weight average molecular weight of the polymers containing photopolymerizable olefinic double bonds is in general above 15,000. The photopolymerizable, olefinically unsaturated organic compounds can be used alone or mixed with each other. The nature and amount of the photopolymerizable, olefinically unsaturated organic compounds used depend largely on the intended application of the photopolymerizable recording materials and on the nature of the other constituents used.

Representatives of photopolymerizable monomers are in particular the derivatives of (meth)acrylic acid, specifically (meth)acrylic esters. Examples thereof are di- and tri-(meth)acrylates of ethylene glycol, diethylene glycol, triethylene glycol or polyethylene glycols having a molecular weight of up to about 500, 1,2-propanediol, 1,3-propanediol, polypropylene glycols having a molecular weight of up to about 500, 1,4- butanediol, 1,6-butanediol, 1,1,1-trimethylolpropane, 2,2-dimethylpropanediol, glycerol or pentaerythritol, pentaerythritol tetra(meth)acrylate, glucose tri- or tetra-(meth)acrylate, and also the monoacrylates and monomethacrylates of the diols and polyols mentioned, eg. ethylene glycol di-, tri- or tetraethylene glycol mono(meth)acrylate, propanediol mono(meth)acrylate and butanediol mono(meth)acrylate, similarly the (meth)acrylates of monoalkanols, in particular of those having 1 to 20 carbon atoms. Aside from the preferred acrylates and methacrylates of the aforementioned kind, suitable photopolymerizable monomers also include allyl compounds and other vinyl compounds, eg. N-vinylpyrrolidone, N-vinylcarbazole, N-vinylcaprolactam, vinyl acetate, vinyl propionate, (meth)acrylamide, N-methylol (meth)acrylamide, the bisether of ethylene glycol and N-methylol (meth)acrylamide, vinyl carbamates, bisacrylamidoacetic acid, glyoxalbisamide and the like.

Highly suitable photopolymerizable, olefinically unsaturated organic compounds for the photopolymerizable recording materials according to the invention also include monomeric urethane acrylates or methacrylates having two or more acryloyl and/or methacryloyl groups. Such monomeric urethane (meth)acrylates can be obtained for example by reacting aliphatic di- or polyols with organic diisocyanates in an equivalent ratio OH:NCO of about 1:2 and subsequent reaction of the free isocyanate groups of the reaction products obtained with suitable acryloyl and/ or methacryloyl compounds, for example hydroxyalkyl (meth)acrylates. Suitable aliphatic di- and/or polyols are inter alia the dihydroxy and polyhydroxy compounds mentioned above in connection with di- and tri-(meth)acrylates; examples of organic diisocyanates are hexamethylene diisocyanate, tolylene diisocyanate, isophorone diisocyanate and the like: hydroxyalkyl (meth)acrylates are for example hydroxyethyl (meth)acrylate, propanediol mono(meth)acrylate and butanediol mono(meth)acrylate. Similarly suitable and advantageous are monomers having two or more acryloyl and/or methacryloyl groups, as can be obtained for example by reacting di- or polyglycidyl compounds with acrylic acid and/or methacrylic acid or by reacting glycidyl (meth)acrylate with di- or polyols, in particular aliphatic di- or polyols, as mentioned above for example in connection with di- and tri(meth)acrylates. Suitable di- and polyglycidyl compounds here are in particular the di- and polyglycidyl ethers of polyhydric aliphatic alcohols or of polyhydric phenols, for example of bisphenol A or of substitution products thereof. Examples of such acryloyl- and/or methacryloyl-containing monomers are the reaction products of bisphenol A bisglycidyl ether with acrylic and/or methacrylic acid in a molar ratio of about 1:2, and 1,6-hexanediol bisglycidyl ether methacrylate.

It has proved advantageous, in particular for the production of photoresist layers, if the photopolymerizable, olefinically unsaturated organic compounds in the photopolymerizable recording materials are oligomers having two or preferably more than two acryloyl and/or methacryloyl groups. They can comprise for example acryloyland/or methacryloyl-containing oligomeric urethane resins or those based on di- or polyepoxies as disclosed and described as such in the literature. For aqueously developable photopolymerizable recording materials, those oligomers of the type in question are of particular interest here which, besides acryloyl and/or methacryloyl groups, additionally contain free carboxyl groups in the molecule. The proportion of free carboxyl groups in these photopolymerizable oligomers is advantageously sufficiently high for the oligomers to have an acid number within the range from 50 to 150 mg of KOH/g. Suitable photopolymerizable oligomers of this type are described for example in DE-A-2,442,527, DE-C-2,557,408 or else DE-A-2,917,483. Further photopolymerizable oligomers whose use in the photopolymerizable recording materials according to the invention has proved to be advantageous can be prepared for example by reacting the free hydroxyl groups of an acryloyl- and/or methacryloyl-containing diol or polyol compound with polybasic carboxylic acids or derivatives thereof, in particular cyclic carboxylic anhydrides, in such a way as to form the acidic partial esters of the polybasic carboxylic acids and subsequently reacting a proportion of the free carboxyl groups on the reaction product thus obtained with diepoxies and/or polyepoxies to give chain extension with or without branching. The acryloyl- and/or methacryloyl-containing diol or polyol compounds which serve as the starting material for preparing such oligomers are advantageously prepared by reacting diepoxy or polyepoxy compounds, for example diglycidyl or polyglycidyl ethers or diglycidyl or polyglycidyl esters, with acrylic acid and/or methacrylic acid in an equivalent ratio of glycidyl groups:COOH groups of about 1:1. The diepoxy or polyepoxy compounds can also, for example, be extended before or during the reaction with (meth)acrylic acid by reaction with dicarboxylic acids. Representative examples of such oligomers of the last kind are those products obtainable by reacting bisphenol A bisglycidyl ether with acrylic and/or methacrylic acid or a mixture of from about 30 to 70 mol % of a dicarboxylic acid, for example adipic acid, and from about 30 to 70 mol % of acrylic and/or methacrylic acid in an equivalent ratio of glycidyl groups:total COOH of 1:1, reacting the hydroxyl groups of the reaction product thus obtained with a cyclic dicarboxylic anhydride, for example phthalic anhydride, alone or in admixture with a minor amount of the anhydride of another polybasic carboxylic acid, for example trimellitic anhydride, in an equivalent ratio of OH groups:anhydride groups of 1:1 to form the acidic partial ester of the polybasic carboxylic acid, and finally reacting a proportion of the free carboxyl groups of the reaction product thus obtained with a diglycidyl and/or polyglycidyl ether, for example bisphenol A bisglycidyl ether or pentaerythritol glycidyl ether in an equivalent ratio of COOH groups:glycidyl groups of > 1:1, preferably in the range from about 1.15:1 to 5:1.

Examples of polymers containing photopolymerizable olefinic double bonds are those light-sensitive polymers described for example in DE-A-1,522,359.

It will be readily understood by those skilled in the art that the photopolymerizable, olefinically unsaturated organic compounds, which customarily have a boiling point of above 100° C. under atmospheric pressure, have to be selected in such a way that they are compatible with the other constituents of the photopolymerizable recording materials, in particular in any polymeric binders used.

The preferred photopolymerizable recording materials, besides the photopolymerizable, olefinically unsaturated organic compounds, contain polymeric binders, in particular if the photopolymerizable, olefinically unsaturated organic compounds present exclusively comprise photopolymerizable monomers and/or photopolymerizable oligomers. These polymeric binders should be soluble or at least dispersible in the developer solvents for the photopolymerizable recording materials to make it possible to wash put the unexposed and uncrosslinked areas of the layer from these materials after imagewise exposure to actinic light. Examples of suitable polymeric binders are: linear polyamides and in particular alcoholsoluble copolyamides as described in French Patent No. 1,520,856, cellulose derivatives, in particular those which can be washed out with aqueous alkaline developers, vinyl alcohol polymers and polymers and copolymers of vinyl esters of aliphatic monocarboxylic acids of 1 to 4 carbon atoms, as of vinyl acetate, having different degrees of hydrolysis, homopolymers and copolymers of vinylpyrrolidone, of vinyl chloride or of styrene, polyurethanes and polyether urethanes, polyester urethanes, polyester resins, diene polymers and copolymers, such as block copolymers of butadiene and/or isoprene and styrene or α-methylstyrene, but also, in particular for the production of photoresist layers and lithographic printing plates, alkyl acrylate and methacrylate polymers and copolymers. Examples of suitable and preferred polymeric binders are inter alia polymethacrylate, polymethyl methacrylate, alkyl (meth)acrylate copolymers which contain amino-containing comonomers, eg. dimethylaminoethyl metharylate, in polymerized form, copolymers of alkyl (meth)acrylates and (meth)acrylic acid which may contain still further comonomers, eg. N-vinyllactams, hydroxyalkyl (meth)acrylates or styrene, in polymerized form, copolymers of styrene and maleic anhydride and/or maleic half-esters or even copolymers of styrene, maleic anhydride and (meth)acrylic acid.

The photopolymerizable recording materials according to the invention further contain, in addition to photooxidant (b) of the color-forming system, as further light-sensitive component one or more photopolymerization initiators which are capable under the influence of actinic light of initiating the free radical polymerization of the photopolymerizable, olefinically unsaturated organic compounds in the photopolymerizable recording materials. Of particular advantage here are those aromatic carbonyl compounds known for use as photoinitiators, in particular aromatic ketones which have a structural unit of the general formula (XXV)

where Ar is substituted or unsubstituted aryl, in particular substituted or unsubstituted phenyl. The two Ar's in the structural unit of the general formula (XXV) can be identical or different and may also be linked to each other, for example via a —CH— group or an —S— atom. Preferably, the photopolymerization initiators selected have no strong absorption ($\epsilon < 5000$) in the wavelength range of the actinic light in which the sensitizers present in the photopolymerizable recording materials according to the invention have their absorption band(s). Specific examples of preferred photopolymerization initiators are: benzophenone, substituted benzophenones, such as 4,4'-dichlorobenzophenone, benzoin ethers, benzil dialkyl ketals, polynuclear unsubstituted quinones, such as anthraquinone, benzanthraquinone, 2-ethylanthraquinone or tertbutylanthraquinone, thioxanthone and derivatives thereof, eg. 2-methyl thioxanthone and 2-chlorothioxanthone.

Besides the constituents mentioned, the photopolymerizable recording materials according to the invention may also contain further customary additive and/or auxiliary substances which improve and/or modify the processing and/or application properties of the recording materials. These substances include inter alia thermal polymerization inhibitors, inorganic or organic pigments or dyes which can act not only as contrast aids but also as layer conaolidants, low molecular weight adhesion promoters, flow control agents, delusterants, lubricants, plasticizers and the like.

The constituents of the photopolymerizable recording materials according to the invention are used in the customary amounts and mixing ratios and are present in the recording materials in homogeneous mixture. To prepare the photopolymerizable recording materials, the constituents are homogeneously mixed with one another in a conventional manner, for example in solution in a suitable solvent or solvent mixture or in a mixing apparatus, such as a kneader, extruder or the like. Preferably, the nature and the quantity of the individual constituents of the photopolymerizable recording materials according to the invention are adapted to one another in such a way that the resulting mixture is solid (after removal of solvent, if the mixture was prepared in solution).

The photopolymerization and the color formation or the deepening of the color intensity in the photopolymerizable recording materials according to the invention are triggered using actinic light of wavelengths of from 300 to 420 nm, in particular of from 320 to 400 nm. Suitable sources of radiation are inter alia high pressure mercury lamps, medium pressure mercury lamps, low pressure mercury lamps, superactinic fluorescent tubes, pulsed xenon lamps, UV fluorescent tubes and the like.

The recording materials according to the invention can be processed in a conventional manner into UV-curable overcoats, photopolymer printing plates of any kind, relief forms, photoresists and the like. They are particularly advantageous wherever irradiation with actinic light is to bring about not only efficient photopolymerization in the exposed areas but also a very big change in the color intensity and a very big color contrast, as for example in light-sensitive recording elements having a thin layer of the photopolymerizable recording materials according to the invention mounted on a base material, in particular dry film resists for dry layer transfer and lithographic printing plates. Suitable base materials for these light-sensitive recording elements are the dimensionally stable, preferably flexible, materials customary for this purpose, such as plastic films or foils and metal sheets. Proven base materials for dry film resists are in particular polyester foils, made for example of polyethylene terephthalate or polybutylene terephthalate. Lithographic printing plate base materials comprise in particular offset aluminum sheets whose surface has been mechanically, chemically and/or electrochemically roughened and pretreated in a conventional manner. The thin layer of photopolymerizable recording material according to the invention, the thickness of which for dry film resists is customarily within the range from about 10 to 100 μm, in particular within the range from about 1 to 6 μm, is applied to the base materials using an existing application technique, for example casting from solution, spincoating or the like.

To produce lithographic printing forms, the lithographic printing plates produced using the photopolymerizable recording materials according to the invention are subjected in a conventional manner to imagewise exposure with actinic light and developed by washing out with a suitable developer solvent. To produce imagewise structured resist patterns, the photopolymerizable recording material according to the invention is applied in layer form to the substrate to be protected or to be permanently modified, either directly, for example from solution, or by laminating on a prefabricated layer by the layer transfer method using a dry film resist. Suitable substrates, given that the nature of the substrate is known to depend on the particular application intended for the resist pattern to be produced, are the materials customary and known in this area, for example copper sheets or copperclad base materials. To produce the imagewise structured resist pattern, the photoresist layer of photopolymerizable recording material according to the invention applied to the substrate is subjected to imagewise exposure with actinic light and then developed to remove the unexposed areas of the layer with a suitable washout developer solvent. The imagewise exposure of the photopolymerizable recording materials according to the invention can be effected with actinic light within the aforementioned wavelength range. The nature of the washout developer solvent depends on the constituents used for the buildup of the photopolymerizable recording materials according to the invention, in particular on the polymeric binder used and/or the photopolymerizable, olefinically unsaturated organic compounds. Accordingly, it is possible to use not only organic solvents or solvent mixtures but also aqueous developer solutions.

The color-forming system in the photopolymerizable recording materials according to the invention is of high stability. The photopolymerizable recording materials therefore show excellent dark storability without the addition of large amounts of a thermal inhibitor, as is necessary with prior art products. On exposure to actinic light the photopolymerizable recording materials according to the invention show an unexpectedly large increase in color intensity and a stronger color contrast between exposed and unexposed areas than is obtained with comparable prior art products where the photooxidant is an organic halogen compound. This is completely surprising, in particular since the prior art photographic recording materials based on a similar color-forming system where, however, compared with the photopolymerizable recording materials according to the invention, no photopolymerizable organic compounds, photoinitiators and sensitizers are present, show only a relatively weak color change within comparable exposure times. Effectively, the use of the photooxidants in the photopolymerizable recording materials according to the invention has no adverse effect on the other application properties important for the production and use of these recording materials. On the contrary, the materials according to the invention frequently even have somewhat better exposure properties. Also of advantage, in particular for their use in photoresist materials, is the weak fluorescence behavior of the sensitizers according to the invention, as a result of which it is possible to dispense with the addition of other substances for the absorption of such scatter radiation and it is possible to produce even finer conducting path structures. Particular preference is given in this respect to sensitizers of the general formula (V) where $R^{10}$ is Br, eg. compounds of the formulae (IX) to (XI).

Moreover, the photopolymerizable recording materials according to the invention are surprisingly a solution to the residual layer problem, i.e. the layers produced from the photopolymerizable recording materials according to the invention, subjected to imagewise exposure and developed are removable again from the substrate without leaving any residue even after a prolonged period by stripping with a solvent. This is of great importance in particular for the use as a photoresist, for example in the production of circuit boards and integrated circuits.

The invention is further illustrated by the Examples which follow. The parts and percentages in the Examples and Comparisons are by weight, unless otherwise stated.

EXAMPLE 1

A homogeneous mixture was prepared from the following constituents:
250 parts of ethyl acetate,
16 parts of trimethylolpropane triacrylate,
18 parts of the equimolar reaction product of bis phenol A bisglycidyl ether with acrylic acid,
54 parts of polymethyl methacrylate having a weight average molecular weight of 153,000,
3.0 parts of benzophenone,
0.15 part of benzotriazole of formula (VII),
0.8 part of crystal violet leuco base,
2.0 parts of N-methoxy-2-picolinium tosylate,
0.05 part of Sicomet Patent Blue
6.0 parts of triethylene glycol diacetate.

This solution was first cast onto a polyester foil in such a way that the dry film thickness after solvent flashoff and drying was 35 μm. The optical density of the layer at 600 nm was 0.12.

To produce a resist pattern, the photopolymerizable resist layer was laminated at 110oC onto a copper-clad circuit board substrate and subjected to a 30-second exposure through a photographic negative in a flat exposure unit with actinic light of a wavelength of 360 nm; the polyester foil was then removed and the unexposed areas of the layer washed out with 1,1,1-trichloroethane. Exposure had brought about a strong deepening in the color intensity in the layer, the optical density of the layer at 600 nm changing by 1.14 to 1.26. The resist pattern produced was immaculately strippable from the substrate with methylene chloride, without a residual coating being left behind, even after storage for 3 days.

COMPARISON A

Example 1 was repeated, except that this time the 2 parts of N-methoxy-2-picolinium tosylate used in preparing the mixture were replaced by 3 parts of 2,5-dichloro-1,4-bis(dichloromethyl)benzene and the proportion of triethylene glycol diacetate was reduced from 5.94 parts to 4.94 parts. Starting from the same optical density at 600 nm of the unexposed resist layer, this time the increase in optical density brought about by exposure was merely 0.2. The color contrast between exposed and unexposed areas was appreciably weaker.

EXAMPLE 2

A homogeneous mixture was prepared from the following constituents:
250 parts of ethyl acetate, 18.5 parts of trimethylolpropane triacrylate,
16.5 parts of the equimolar reaction product of bisphenol A bisglycidyl ether with acrylic acid,
56 parts of polymethyl methacrylate/acrylic acid copolymer,
0.5 part of leuco crystal violet,
1.8 parts of 2,2'-bis(o-chlorophenyl)-4,4',5,5'-tetraphenylbisimidazolyl,
0.15 part of benzotriazole of formula (X),
0.05 part of Flexoblau,
6.5 parts of triethylene glycol diacetate.

Example 1 was repeated to produce a layer of 35 pm in thickness, which was applied to a copper-clad circuit board substrate.

Exposure as described in Example 1 brings about a strong deepening in the color intensity, the optical density of the layer at a wavelength of 600 nm increasing by 0.55 to 0.95.

COMPARISON B

Example 2 was repeated, except that this time the sensitizer of formula (VIII) was replaced in preparation of the mixture by Michler's ketone.

The unexposed resist layer had the same optical density, while exposure brought about an optical density of 0.69.

EXAMPLES 3 TO 14

Example 2 was repeated and the following changes in optical density OD were measured.

| Example | Sensitizer of formula | Photo-oxidant | Optical density (600 nm) after 30 seconds' exposure |
|---|---|---|---|
| 3 | (VIII) | A | 0.8 |
| 4 | (XI) | A | 0.9 |
| 5 | (IX) | A | 0.92 |
| 6 | [structure: methoxyphenyl-triazole-phenyl-N(CH3)(phenyl)] | 8 | 0.81 |
| 7 | [structure: diphenyl triazole with p-N(CH3)2 phenyl] | A | 0.72 |
| 8 | [structure: cyclohexyl-triazole with p-N(CH3)2 phenyl] | A | 0.74 |
| 9 | [structure: benzotriazole with 3-Br-4-N(C2H5)2 phenyl] | A | 0.78 |
| 10 | [structure: HO-benzotriazole with p-N(C2H5)2 phenyl] | A | 0.74 |
| 11 | (VI) | B | 0.97 |
| 12 | [structure: 4,5-dimethyl-triazole with p-N(C2H5)2 phenyl] | C | 0.72 |

-continued

| Example | Sensitizer of formula | Photo-oxidant | Optical density (600 nm) after 30 seconds' exposure |
|---|---|---|---|
| 13 | 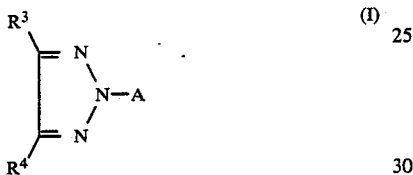 | A | 0.81 |

A = 2,2'-bis(o-chlorophenyl)-4,4',5,5'-tetraphenylbisimidazole
B = N-methoxy-2-picolinium tosylate
C = N-methoxy-3,5-dimethylpyridinium tosylate

We claim:

1. A photopolymerizable recording material composed of one or more photopolymerizable olefinically unsaturated organic compounds, a polymeric binder, one or more photopolymerization initiators, a color-forming system which on irradiation with actinic light causes an increase in the color intensity of the recording material, a sensitizer and further auxiliary substances, wherein the sensitizer comprises one or more compounds of the formula I

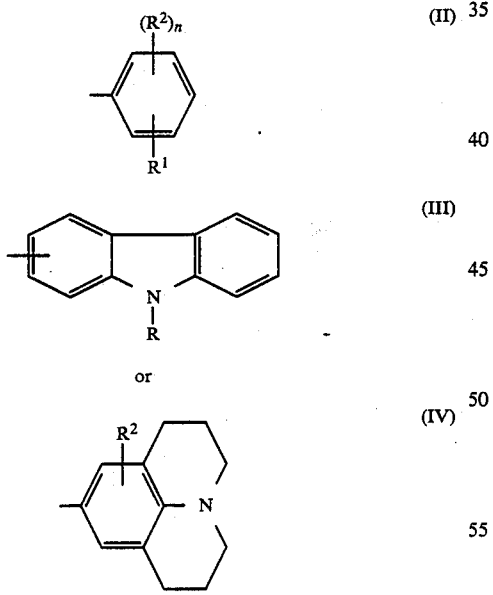

where

A is one of the radicals of the formulae (II) to (IV)

R is hydrogen or $C_1$–$C_8$ $R^1$ is $C_1$–$C_{12}$-alkyl, $C_1$–$C_{12}$-alkoxy, phenyl or an $NR^5R^6$ group where $R^5$ and $R^6$ are identical to or different from each other and each is $C_1$–$C_{12}$-alkyl; allyl; phenylalkyl having 1 to 4 carbon atoms in the alkyl group; phenyl; phenyl substituted by $C_1$–$C_4$-alkyl, $C_1$–$C_4$-alkoxy or halogen; $C_1$–$C_{12}$-alkyl substituted by OH—, halogen-, CN—, —O—CO-alkyl having 1 to 6 carbon atoms in the alkyl group or —CO—O-alkyl having 1 to 6 carbons in the alkyl group; oxaalkyl of 3 to 12 carbon atoms and 1 to 5 oxygen atoms; or $R^5$ and $R^6$ carbon atoms and 1 to 5 oxygen atoms; or $R^5$ and $R^6$ together form a julolidine, carbazole, morpholine, piperidine or N-alkyl-piperidine radical, $R^2$ is hydrogen, $C_1$–$C_{12}$-alkyl, $C_1$–$C_{12}$-alkoxy, halogen or trialkylsilyl, n is 1 or 2, $R^3$ and $R^4$ are identical to or different from each other and each is $C_1$–$C_8$-alkyl, cycloalkyl, $CO_2R^7$ where $R^7$ is $C_1$–$C_8$-alkyl, cycloalkyl, $CO_2R^7$ where $R^7$ is $C_1$–$C_{12}$-alkyl; aryl; phenyl; or phenyl substituted by halogen, $C_1$–$C_{12}$-alkyl- or $C_1$–$C_4$-alkoxy; or $R^3$ and $R^4$ together form a carbocyclic or heterocyclic saturated or unsaturated fused ring system which is monosubstituted or polysubstituted by halogen; OH; CN; —O—CO-alkyl having 1 to 6 carbon atoms in the alkyl group; —CO—O-alkyl having 1 to 8 carbon atoms in the alkyl groupl trifluoromethyl; $C_3$–$C_6$-cycloalkyl; $C_1$–$C_8$-alkoxy; phenylalkyl having 1 to 4 carbon atoms in the alkyl gorup; $C_1$–$C_{12}$-alkyl; $C_1$–$C_{12}$-alkyl substituted by OH-, halogen-, CN—, —O—CO-alkyl- having 1 to 6 carbon atoms in the alkyl group, or —CO—O-alkyl having 1 to 6 carbon atoms in the alkyl group; oxaalkyl containing 2 to 12 carbon atoms and 1 to 6 oxygen atoms; trialkylsilyl having 1–4 carbons in the alkyl groups; or $NR^8R^9$, where $R^8$ and $R^9$ are identical to or different from each other and each is $C_1$–$C_8$-alkyl; $C_1$–$C_8$-alkyl substituted by OH, halogen-, CN—, —O—CO-alkyl having 1 to 6 carbon atoms in the alkyl group or —CO—O-alkyl having 1 to 6 carbon atoms in the alkyl group; oxaalkyl containing 3 to 12 carbon atoms and 1 to 5 oxygen atoms; phenylalkyl having 1 to 4 carbon atoms in the alkyl group; phenyl; or phenyl substituted by $C_1$–$C_4$-alkyl, $C_1$–$C_4$-alkoxy- or halogen, with the proviso that the maximum of the long-wave absorption band of these compounds is below 420 nm.

2. A photopolymerizable recording material as defined in claim 1, wherein the sensitizer comprises a compound of the formula (I) where A is a radical of the formula (II), $R^1$ is para relative to the linkage site with the triazole ring, and n is 1.

3. A photopolymerizable recording material as defined in claim 1, wherein the sensitizer comprises a compound of the formula (I) where A is the radical of the formula (II) and $R^1$ is —$NR^5R^6$ where $R^5$ and $R^6$ are as defined in claim 1 and $R^3$ and $R^4$ together form a substituted or unsubstituted aromatic ring system.

4. A photopolymerizable recording material as defined in claim 1, wherein the sensitizer comprises a compound of the formula (V)

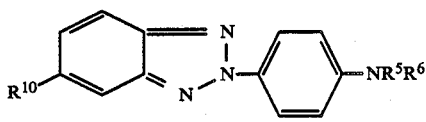 (V)

where $R^5$ and $R^6$ are as defined in claim 1 and $R^{10}$ is halogen.

5. A photopolymerizable recording material as defined in claim 1, wherein the color-forming system which on irradiation with actinic light causes an increase in the color intensity of the recording material comprises (a) one or more colorless or virtually colorless organic compounds which are oxidizable to colored compounds, and (b) a photooxidant for the colorless or virtually colorless organic compound(s) (a).

6. A photopolymerizable recording material as defined in claim 5, wherein the photopolymerization initiator or photooxidant comprises one or more hexaarylbisimidazolyls.

7. A photopolymerizable recording material as defined in claim 5, where photooxidant (b) comprises one or more N-alkoxypyridinium salts.

8. A photopolymerizable recording material as defined in claim 1, wherein the colorless or virtually colorless organic compound which is oxidizable to a colored compound comprises a leuco dye, in particular a triarylmethane dye in its leuco form.

9. A photopolymerizable recording material as defined in claim 5, wherein the colorless or virtually colorless organic compound which is oxidizable to a colored compound comprises a leuco dye, in particular a triarylmethane dye in its leuco form.

10. A photoresist layer based on a photopolymerizable recording material as defined in claim 1.

11. A photoresist layer based on a photopolymerizable recording material as claimed in claim 5.

12. A photoresist layer based on a photopolymerizable recording material as defined in claim 6.

13. A photoresist layer based on a photopolymerizable recording material as defined in claim 7.

14. A lithographic printing plate based on a photopolymerizable recording material as claimed in claim 1.

15. A lithographic printing plate based on a photopolymerizable recording material as defined in claim 5.

16. A photopolymerizable recording material as defined in claim 1, wherein the maximum of the longwave absorption band of the compounds is below 400 nm.

* * * * *

UNITED STATES PATENT AND TRADEMARK OFFICE
CERTIFICATE OF CORRECTION

PATENT NO. : 4,962,011

DATED : October 9, 1990

INVENTOR(S) : Reinhard ALDAG et al.

It is certified that error appears in the above-identified patent and that said Letters Patent is hereby corrected as shown below:

CLAIM 1 column 22, line 17: delete "or $R^5$ and $R^6$ carbon atoms and 1 to 5 oxygen atoms;"

column 22, line 26: delete "cycloalkyl, $CO_2R^7$ where $R^7$ is $C1C_{12}$-alkyl;"

column 22, line 28: "$C_1-C_{12}$-alkyl-" should read --$C_1-C_4$-alkyl--- column 22, line 34: "group1" should read --group;--

Signed and Sealed this

Seventh Day of January, 1992

Attest:

HARRY F. MANBECK, JR.

Attesting Officer        Commissioner of Patents and Trademarks